(12) United States Patent
Chandra

(10) Patent No.: US 6,508,970 B2
(45) Date of Patent: Jan. 21, 2003

(54) LIQUID TRANSFER MOLDING SYSTEM FOR ENCAPSULATING SEMICONDUCTOR INTEGRATED CIRCUITS

(75) Inventor: Haryanto Chandra, Sunnyvale, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/354,291

(22) Filed: Jul. 15, 1999

(65) Prior Publication Data

US 2002/0158366 A1 Oct. 31, 2002

(51) Int. Cl.[7] .................. B29C 45/02; B29C 45/14; B29C 70/70
(52) U.S. Cl. ............... 264/272.17; 425/116; 425/129.1; 425/543; 425/544; 425/258; 425/449
(58) Field of Search .............. 425/116, 129.1, 425/542, 543, 544, 256, 258, 447, 449; 264/272.11, 328.5, 272.17

(56) References Cited

U.S. PATENT DOCUMENTS

| | | | | |
|---|---|---|---|---|
| 3,137,750 A | * | 6/1964 | Gringras | 264/257 |
| 4,043,027 A | | 8/1977 | Birchler et al. | 29/588 |
| 4,260,359 A | * | 4/1981 | Dannels et al. | 425/543 |
| 4,443,175 A | * | 4/1984 | Rose et al. | 425/208 |
| 4,781,561 A | * | 11/1988 | Casa et al. | 425/135 |
| 5,187,001 A | * | 2/1993 | Brew | 425/145 |
| 5,393,215 A | * | 2/1995 | Donovan, Sr. | 425/129.1 |
| 5,433,915 A | * | 7/1995 | Yamamoto et al. | 264/510 |
| 5,698,242 A | * | 12/1997 | Chen et al. | 425/544 |
| 5,906,782 A | * | 5/1999 | Blanchard et al. | 264/328.4 |
| 5,927,560 A | * | 7/1999 | Lewis et al. | 222/263 |
| 5,955,115 A | | 9/1999 | Bolanos et al. | 425/116 |
| 5,992,688 A | * | 11/1999 | Lewis et al. | 222/1 |
| 6,216,752 B1 | * | 4/2001 | Bailey | 425/572 |

FOREIGN PATENT DOCUMENTS

| | | |
|---|---|---|
| GB | 2 055 681 | 3/1981 |
| GB | 2 273 175 | 6/1994 |
| GB | 2 289 011 | 11/1995 |
| GB | 2 323 555 | 9/1998 |
| JP | 61-85830 | * 5/1986 |
| JP | 11330112 | 11/1999 |

* cited by examiner

*Primary Examiner*—Angela Ortiz
(74) *Attorney, Agent, or Firm*—Fish & Richardson P.C.

(57) ABSTRACT

An encapsulation system is used to encapsulate semiconductor products. A bottom mold unit includes a mold pot and a mold piston. A substrate loader loads a substrate into a cavity in the bottom mold unit. A liquid dispenser dispenses encapsulation material into the mold pot. The encapsulation material is in an uncured liquid state when placed into the mold pot. A top mold unit is clamped to the bottom mold unit.

8 Claims, 5 Drawing Sheets

LIQUID TRANSFER MOLDING SYSTEM FOR ENCAPSULATING SEMICONDUCTOR INTEGRATED CIRCUITS

BACKGROUND

1. Field of the Invention

The present invention concerns integrated circuits and pertains particularly to a liquid transfer molding system for encapsulating semiconductor integrated circuits.

2. Related Information

After the manufacture of integrated circuits on a silicon wafer surface, the wafers are typically sawn into individual die. Each die is then attached onto a substrate (for example a leadframe), and bonding wires are used to provide electrical connection from the die to the outside world.

In general, transfer molding is the most widely-used method of encapsulating semiconductor devices because of the versatility and high throughput of such systems. The encapsulation materials used in transfer molding systems normally come in solid form. They are made by pelletizing fine powder of a mixture of resin, filler, hardener, catalyst, carbon black, etc. Some of the disadvantages of using these pelletized mold compounds are dust (escaping from pellets), non-uniform density across the pellets, and moisture absorption.

Liquid encapsulating materials, on the other hand, do not have the problems associated with pageetized powder. They do not produce dust and are very uniform in density and other properties. Most of the encapsulating materials for optoelectronics come in liquid form. Thus they cannot be used directly in a transfer mold system. One way that is commonly used is to turn the liquid materials into solid by partially curing (called B-stage) the materials to a certain degree and forming it into pellet form. However, in this partially cured state, the material has a higher viscosity and thus a degraded flow behavior. In addition, the partially cured state results in poorer adhesion to substrates.

SUMMARY OF THE INVENTION

In accordance with the preferred embodiment of the present invention an encapsulation system is used to encapsulate semiconductor products. A bottom mold unit includes a mold pot and a mold piston. A substrate loader loads a substrate into a cavity in the bottom mold unit. A liquid dispenser dispenses encapsulation material into the mold pot. The encapsulation material is in an uncured liquid state when placed into the mold pot. A top mold unit is then clamped to the bottom mold unit.

The present invention allows the use of liquid encapsulating materials to replace the solid mold compounds in many applications. The present invention also facilitates high volume production at lower cost for optoelectronic devices such as light emitting diode (LED) displays or infrared devices.

In addition, the superior adhesion of liquid encapsulating material results in better quality products produced at lower cost than is possible using B-stage (partially cured) materials. This is because additional processes are required to produce B-stage materials, resulting in higher costs of the final product.

Further, using liquid materials opens up new applications for transfer mold such as in the optoelectronics, where many of the optoelectronic devices are encapsulated using cast process. In general, cast process has longer cycle time, lower throughput, and is less automated.

Also, using a liquid materials within a transfer mold system, it is possible to have lower molding temperature if necessary. This is possible because of much lower viscosity of liquid materials as opposed to solid mold compounds, which take relatively more time to melt and have higher viscosity. Besides lower viscosity, liquid encapsulating materials have less air and moisture content as opposed to the pelletized mold compounds. This results in fewer air entrapment or defect in final cured material.

Unlike standard transfer mold, which uses pelletized mold compounds, the use of an automatic liquid dispensing system, as in the present invention, allows the amount of liquid material dispensed to be controlled or adjusted with greater flexibility. This is especially helpful during initial process optimization or debug. The amount of waste material can thus be reduced. Such adjustment is difficult, if not impossible, with pellet mold compounds since that would mean a different pellet size, something that the compound manufacturer would have to provide.

DESCRIPTION OF THE PREFERRED EMBODIMENT

In accordance with a preferred embodiment of the present invention, a liquid dispensing system is incorporated within a transfer mold process in order to allow the use of liquid encapsulating materials in place of the solid molding compounds. The resulting liquid transfer mold system has the high throughput characteristic of transfer mold systems and also the superior flow and adhesion characteristics of liquid encapsulant systems. The present invention allows expansion of the use of transfer mold process within the manufacture of many other semiconductor devices (such as optoelectronics) whose encapsulating materials are currently available only in liquid form.

Figure 1:
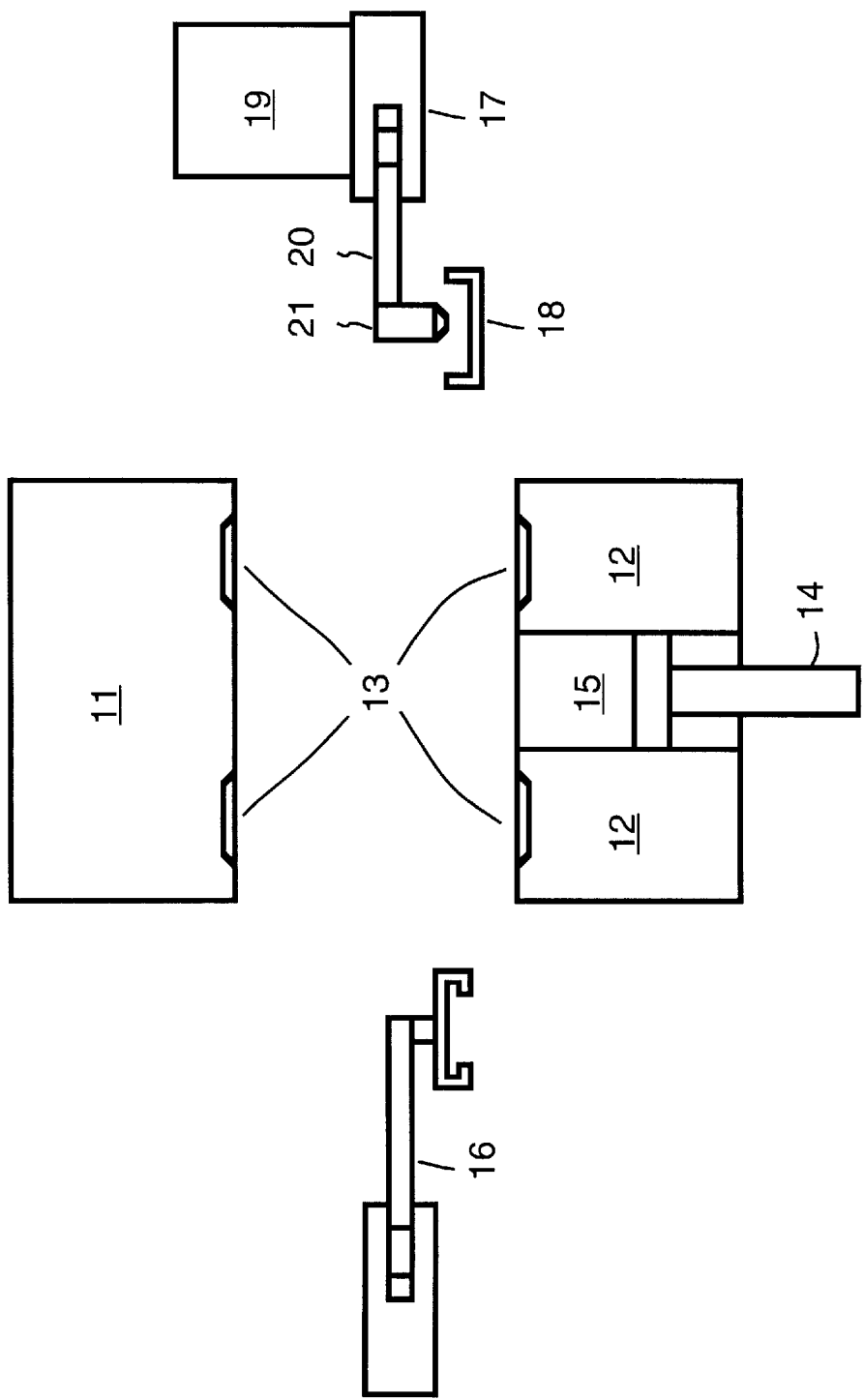
FIG. 1 is a simplified block diagram of a bottom plunger mold system with a liquid dispensing unit forming a liquid transfer mold system in accordance with a preferred embodiment of the present invention.

FIG. 1 shows a bottom plunger mold system having a top mold unit 11 and a bottom mold unit 12. Mold cavities 13 are formed when top mold unit 11 is clamped to bottom mold unit 12. A mold piston/plunger (piston) 14 is used to force liquid encapsulant within a mold pot 15 up into mold cavities 13 during the mold process. While FIG. 1 shows only a single mold piston 14, the bottom plunger mold system may include two or more pistons each in a separate mold pot.

Top mold unit 11 and bottom mold unit 12 are molds such as are available from Intercon Tools, Inc., having a business address of 280 Cochrane Circle, Morgan Hill, Calif. 95037, from Diehard Engineering having a business address of 7070-D Commerce Circle, Pleasanton, Calif. 94588, or from another manufacturer of molds. A bottom plunger mold system that utilizes pelletized mold compounds may be obtained from several manufactures, for example from ASM America, Inc, having a business address of 97 E. Brokaw Road, Suite 100, San Jose, Calif. 95112-4209.

A substrate loader 16 is used to load substrates and lead frames onto bottom mold unit 12 at the location of mold cavities 13. A liquid dispensing system 17 replaces a pelletized mold compound loader found in standard transfer mold machines. Liquid dispensing system 17 includes a liquid encapsulant reservoir 19 that is filled with liquid encapsulation molding material. For example the liquid encapsulation material is a mixture of resin, filler, hardener, catalyst, carbon black, etc. A retractable arm 20 is used to mount a dispensing head 21. An auto-retractable pan 18 is utilized, if necessary to collect any dripping liquid from dispensing head 21. While FIG. 1 shows only a single dispensing head 21, typically, there is a separate dispensing head for each piston.

Liquid dispensing system 17 is, for example, a pump and valve system where the pump is located in liquid encapsulant reservoir 19 and a valve is located in dispensing head 21. Alternatively, liquid dispensing system 17 can be another type of liquid dispensing device from the many kinds of liquid dispensing devices which are readily available commercially. A refrigeration unit can be incorporated in liquid dispensing system 17 to increase the work life of liquid encapsulant, if necessary.

Figure 2:
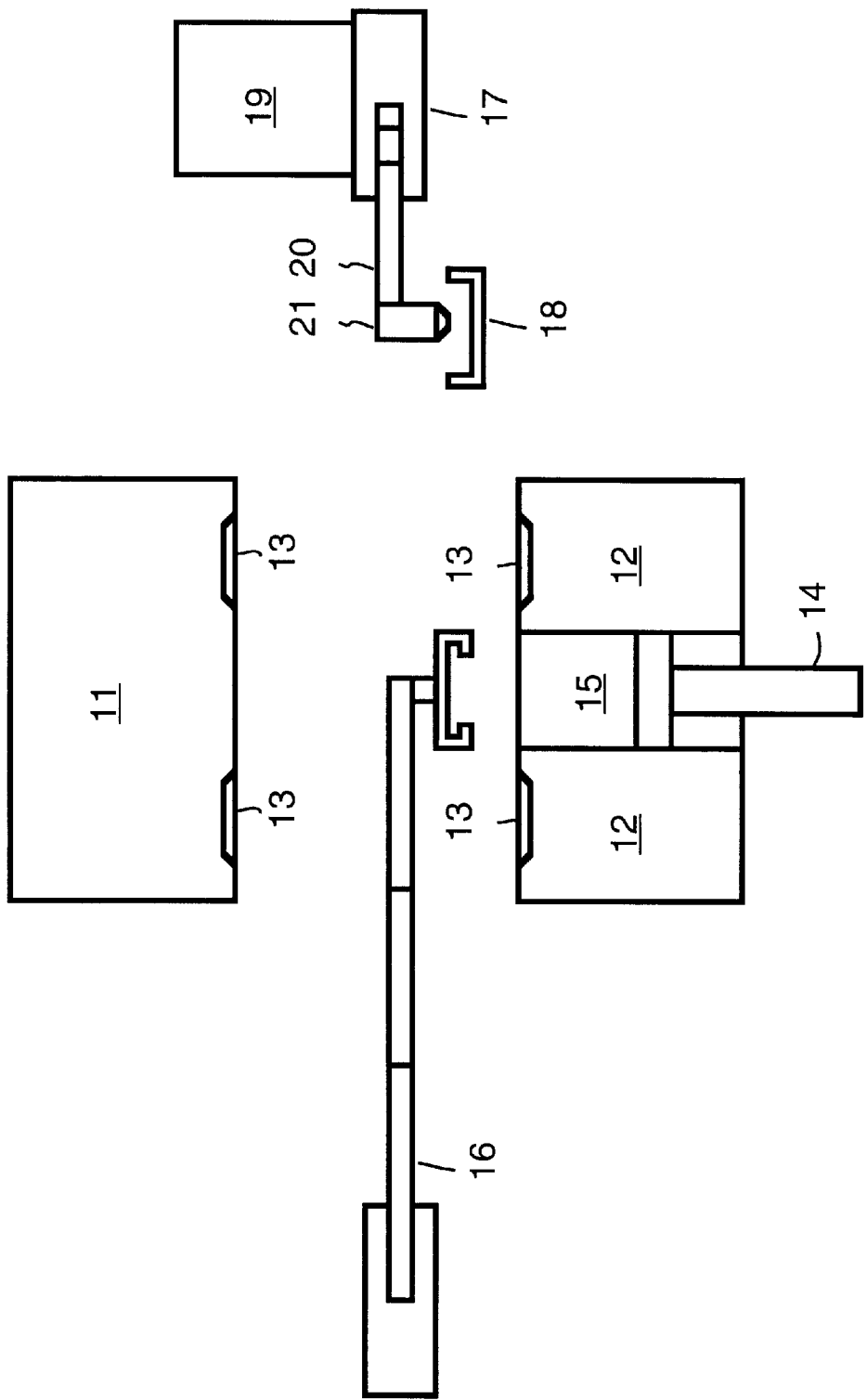
FIG. 2 is a simplified block diagram which illustrates substrate loading of the liquid transfer mold system shown in FIG. 1 in accordance with a preferred embodiment of the present invention.

FIG. 2 illustrates substrate loader 16 performing substrate and lead frame loading. During substrate and lead frame loading, the substrate and lead frames is placed onto bottom mold unit 12 at the location of mold cavities 13.

Figure 3:
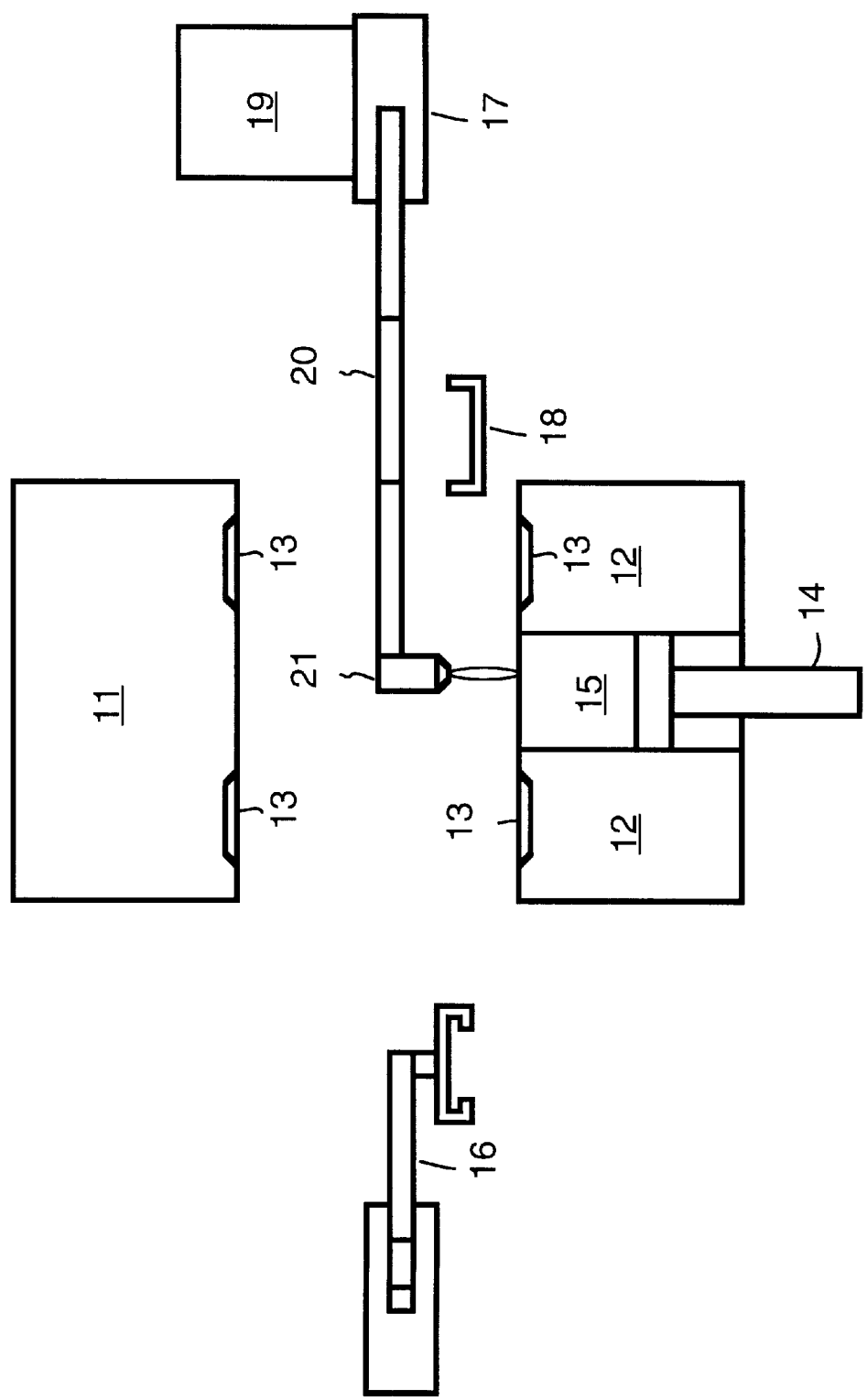
FIG. 3 is a simplified block diagram which illustrates liquid encapsulant dispensing within the liquid transfer mold system shown in FIG. 1 in accordance with a preferred embodiment of the present invention.

FIG. 3 illustrates liquid dispensing system 17 used to dispense liquid encapsulation material from liquid encapsulant reservoir 19. Retractable arm 20 extends placing dispensing head 21 into position to dispense the liquid encapsulation material into mold pot 15.

Figure 4:
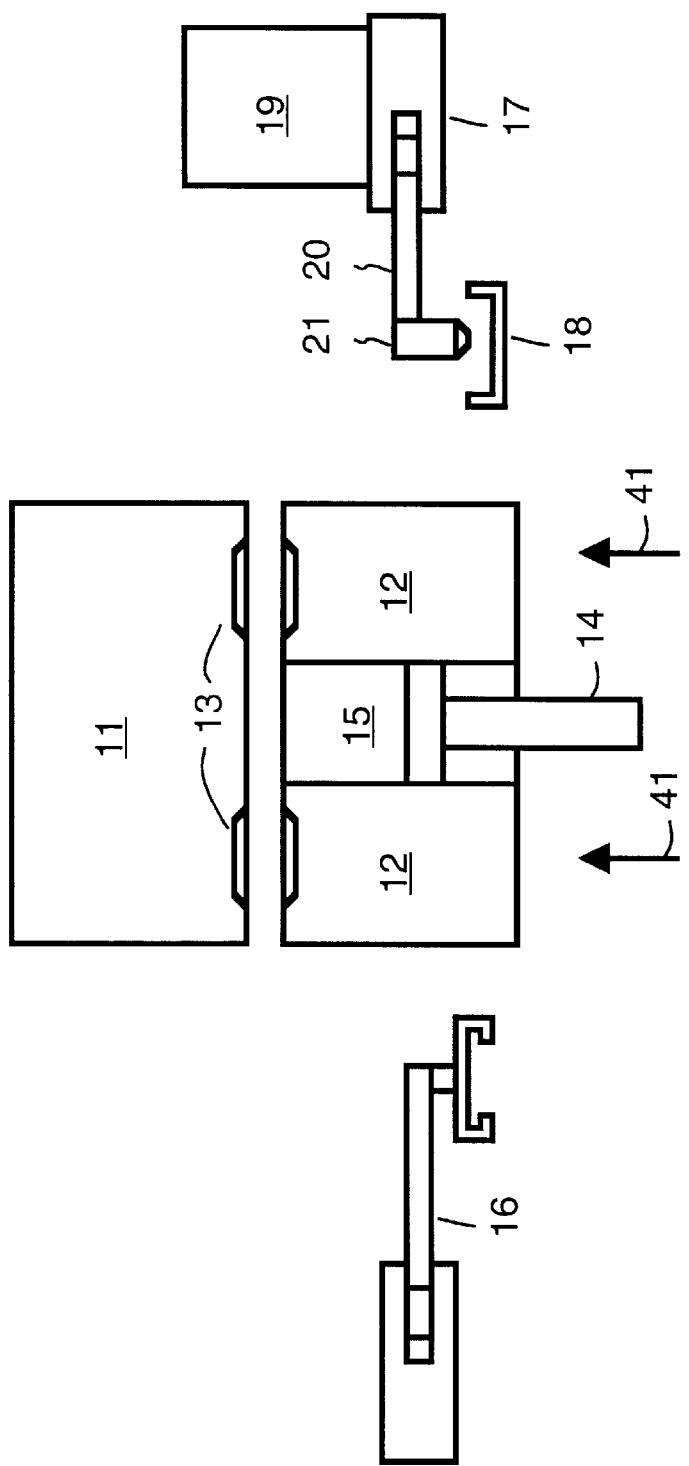
FIG. 4 is a simplified block diagram that illustrates clamping of the mold within the liquid transfer mold system shown in FIG. 1 in accordance with a preferred embodiment of the present invention.

As illustrated in FIG. 4 by arrows 41, bottom mold unit 12 is clamped to top mold unit 11.

Figure 5:
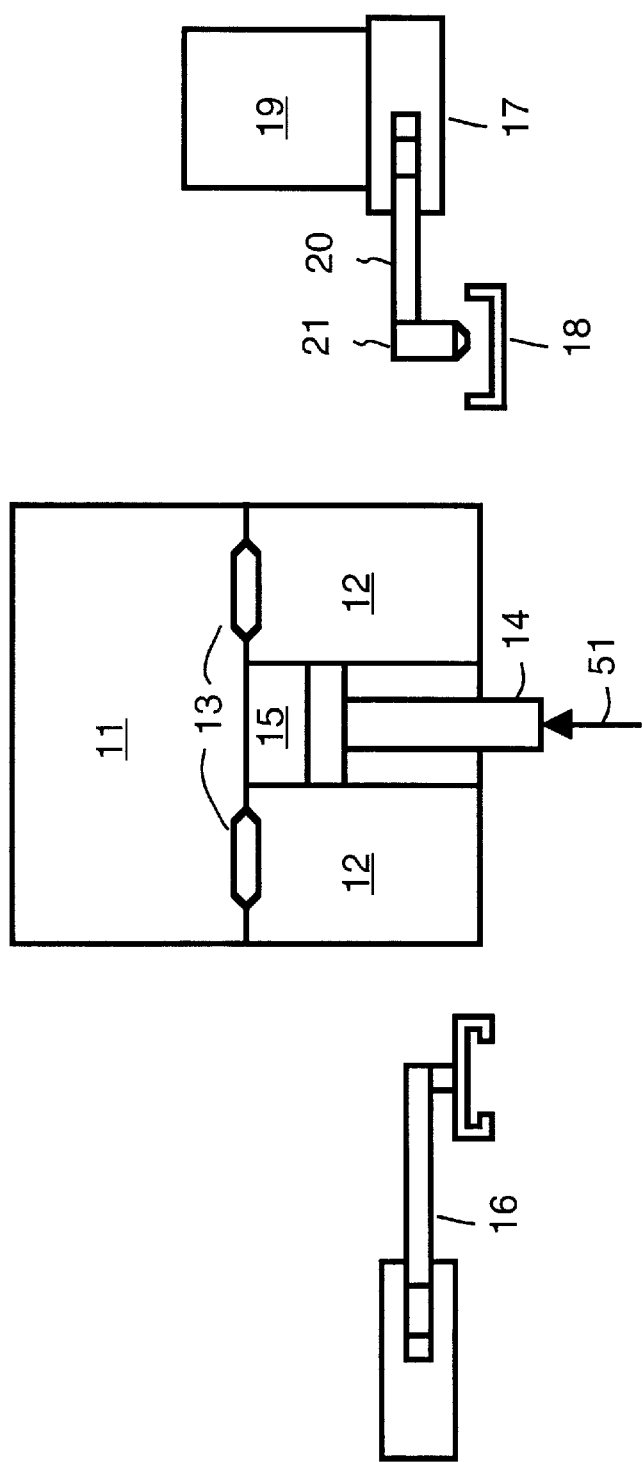
FIG. 5 is a simplified block diagram which illustrates mold cavity filling within the liquid transfer mold system shown in FIG. 1 in accordance with a preferred embodiment of the present invention.

As shown in FIG. 5, mold piston 14 is then moved upwards in order to transfer liquid encapsulation material from mold pot 15 into cavities 13. This is illustrated by an arrow 51.

Once placed into cavities 13, the liquid encapsulation material is cured, for example, at high pressure to eliminate bubbles. This process can also be used in conjunction with vacuum to further increase yield.

What is claimed is:

1. An encapsulation system for encapsulating semiconductor products, the encapsulation system comprising:
   a top mold;
   a bottom mold unit, the bottom mold unit including,
      a mold pot having a cavity formed therein, and
      a mold piston;
   a substrate loader, for loading a substrate into the cavity in the bottom mold unit; and
   a liquid dispenser for dispensing encapsulation material in an uncured liquid state into the mold pot, the liquid dispenser including a retractable arm and a dispenser head attached to the distal end of the retractable arm, wherein the retractable arm is positionable to hold the dispenser head at a location to dispense the encapsulation material into the mold pot.

2. An encapsulation system for encapsulating semiconductor products, the encapsulation system comprising:
   a top mold;
   a bottom mold unit, the bottom mold including,
      a mold pot, and
      a mold piston;
   a substrate loader, for loading a substrate into a cavity in the bottom mold unit; and
   a liquid dispenser for dispensing encapsulation material into the mold pot, the encapsulation material being in an uncured liquid state when placed in the mold pot, wherein the liquid dispenser includes
      a reservoir in which is stored the encapsulation material;
      a dispensing head for dispensing the encapsulation material.

3. An encapsulation system as in claim 1, wherein the top mold unit includes a cavity which lines up with the cavity in the bottom mold unit when the bottom mold unit is clamped to the top mold unit.

4. An encapsulation system as in claim 1, wherein the encapsulation material dispensed into the mold pot is moved to the cavity in the bottom mold unit by extending the mold piston.

5. An encapsulation system as in claim 1, wherein the encapsulation material includes resin, filler, hardener, catalyst and carbon black.

6. An encapsulation system as in claim 2, wherein the top mold unit includes a cavity which lines up with the cavity in the bottom mold unit when the bottom mold unit is clamped to the top mold unit.

7. An encapsulation system as in claim 2, wherein the encapsulation material dispensed into the mold pot is moved to the cavity in the bottom mold unit by extending the mold piston.

8. An encapsulation system as in claim 2, wherein the encapsulation material includes resin, filler, hardener, catalyst and carbon black.

* * * * *